US012013671B1

(12) United States Patent
Chen et al.

(10) Patent No.: US 12,013,671 B1
(45) Date of Patent: Jun. 18, 2024

(54) INTELLIGENT DRIVING TEST METHOD WITH CORNER CASES DYNAMICALLY COMPLETED BASED ON HUMAN FEEDBACK

(71) Applicant: TONGJI UNIVERSITY, Shanghai (CN)

(72) Inventors: Hong Chen, Shanghai (CN); Lin Zhang, Shanghai (CN); Qiang Meng, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 0 days.

(21) Appl. No.: 18/537,769

(22) Filed: Dec. 12, 2023

(30) Foreign Application Priority Data

Jul. 5, 2023 (CN) .......................... 202310822624.0

(51) Int. Cl.
G05B 13/04 (2006.01)
G06F 11/36 (2006.01)
G06F 30/27 (2020.01)

(52) U.S. Cl.
CPC .......... G05B 13/04 (2013.01); G06F 11/3664 (2013.01); G06F 30/27 (2020.01)

(58) Field of Classification Search
CPC ...... G05B 13/04; G06F 11/3664; G06F 30/27
See application file for complete search history.

(56) References Cited

U.S. PATENT DOCUMENTS 11,017,745 B2 * 5/2021 Haar .................... G02B 27/017
11,210,744 B2 * 12/2021 Shalev-Shwartz .... B60W 10/18
11,354,462 B2 * 6/2022 Sui ......................... G01M 17/06
11,551,494 B2 * 1/2023 Morrisey, IV ........ G07C 5/0808
11,634,148 B2 * 4/2023 Yang ..................... B60W 10/18
701/25
11,928,764 B2 * 3/2024 Wang ..................... G06N 5/046
2011/0238289 A1 * 9/2011 Lehmann ........... G01C 21/3617
701/533
2018/0032861 A1 * 2/2018 Oliner ................ G06Q 10/0637
2022/0055689 A1 * 2/2022 Mandlekar ........... B60W 30/06
2023/0401274 A1 * 12/2023 Denninghoff ...... G06Q 30/0251

FOREIGN PATENT DOCUMENTS

WO WO-2021244207 A1 * 12/2021 ........... G05D 1/0214

* cited by examiner

Primary Examiner — Ramesh B Patel
(74) Attorney, Agent, or Firm — Bochner PLLC; Andrew D. Bochner

(57) ABSTRACT

Disclosed is an intelligent driving test method with corner cases dynamically completed based on human feedback, including the following steps: obtaining an initial state of a real environment; building an original scene driver based on reinforcement learning, and correcting behavior selection to obtain an exploratory behavior; testing in a testing environment, performing expert evaluation, and building a dynamic corner case completion library based on the human feedback; building an imitation learning driver based on the human feedback, updating a policy based on test data in the dynamic corner case completion library, training the imitation learning driver, and outputting a corner case reproduction behavior; obtaining the initial state of the real environment and an initial environmental state of the dynamic corner case completion library, and selecting a scene driver; and outputting a corresponding behavior, and testing in the testing environment based on the corresponding behavior to obtain a test result.

10 Claims, 2 Drawing Sheets

INTELLIGENT DRIVING TEST METHOD WITH CORNER CASES DYNAMICALLY COMPLETED BASED ON HUMAN FEEDBACK

CROSS REFERENCE TO RELATED APPLICATION

This patent application claims the benefit and priority of Chinese Patent Application No. 2023108226240, filed with the China National Intellectual Property Administration on Jul. 5, 2023, the disclosure of which is incorporated by reference herein in its entirety as part of the present application.

TECHNICAL FIELD

The present disclosure relates to the field of safety testing of intelligent driving vehicles, and in particular, to an intelligent driving test method with corner cases dynamically completed based on human feedback.

BACKGROUND

With the progress of intelligence algorithms, intelligent driving vehicles are highly anticipated to improve road traffic efficiency and reduce an incidence of traffic accidents. However, due to the problem on interpretability of intelligence algorithms, it is difficult to fully ensure the safety of intelligent driving vehicles. Testing vehicle safety in a natural driving environment is the most reliable method at present, but RAND research shows that it takes 27.5 billion kilometers to perform such a test, which is time-consuming and highly costly. Therefore, an acceleration test of intelligent driving based on a virtual scene has become urgent and attracted wide attention.

A conventional test based on a specific scene is not suitable for safety verification of intelligent driving vehicles, since the intelligence algorithms feature high fitting and low generalization. Therefore, an efficient test scene driver for intelligent driving vehicles is needed. However, it is difficult and expensive to manually set a continuous test scene with high coverage. Moreover, since an intelligence algorithm for a vehicle under test is not unchanging, a dangerous corner case is personalized. A method for safety verification of an intelligent driving vehicle based on reinforcement learning was recently proposed, as the method features gaining experience by environmental interaction. A driver with a high exploration trend is beneficial to dealing with the personalization of an intelligence algorithm, but the testing efficiency is low. A driver with high sample utilization has high testing efficiency, but the driver is likely to fall into local optimum and ignore the most dangerous working conditions.

SUMMARY

An objective of the present disclosure is to provide an intelligent driving test method with corner cases dynamically completed based on human feedback, which adopts a test method that combines active exploration by an original driver and reproduction by an imitation learning driver, thus solving the problem of incomplete scene testing caused by too little experience on the original driver and the problem of low testing efficiency caused by a low exposure rate of new corner cases obtained by exploration.

The objective of the present disclosure can be achieved by the following technical solution.

An intelligent driving test method with corner cases dynamically completed based on human feedback includes the following steps:

1) Model Construction and Training Stage:
obtaining an initial state of a real environment;
building an original scene driver based on reinforcement learning;
training the original scene driver with the initial state of the real environment as an input of the original scene driver, and outputting a maximum probability behavior and a maximum behavior probability;
correcting behavior selection of an output of the original scene driver to obtain an exploratory behavior;
testing in a testing environment based on the exploratory behavior, performing expert evaluation, and building a dynamic corner case completion library based on the human feedback according to a test result of the expert evaluation;
building an imitation learning driver based on the human feedback, updating a policy based on test data in the dynamic corner case completion library, training the imitation learning driver, and outputting a corner case reproduction behavior; and 2) Test Stage:
obtaining the initial state of the real environment and an initial environmental state of the dynamic corner case completion library based on the human feedback, and selecting a scene driver; and
obtaining a corresponding exploratory behavior or corner case reproduction behavior based on the selected scene driver with the initial state of the real environment as an input of the scene driver, and testing in the testing environment based on the corresponding behavior to obtain a test result.

The correcting behavior selection of an output of the original scene driver to obtain an exploratory behavior specifically includes the following steps:
randomly generating a random number that conforms to normal distribution and has a value in the range (0,1);
obtaining a maximum behavior probability and a corresponding maximum probability behavior calculated by using a policy function of the original scene driver; and
comparing the random number with the maximum behavior probability, determining a behavior being executed in a current state, and correcting the behavior selection.

The comparing the random number with the maximum behavior probability, determining a behavior being executed in a current state specifically includes: when the random number is less than the maximum behavior probability, selecting a behavior $a_s = a_{max}$ being executed in the current state, or else randomly selecting a behavior $a_s = a_r$ being executed in the current state, that is:

$$a_s = \begin{cases} a_{max}; & \text{if } p_{\theta max}(a|s) > \varepsilon \\ a_r; & \text{others} \end{cases}$$

where $\theta$ is a parameter of a policy function in a current scene driver; $p_\theta(a|s)$ represents a probability of selecting an action $a$ under a current policy and environmental state $s$, and the action is defined as a driving behavior of a controlled traffic vehicle; $a_r$ represents a random action; ε is a random number; $p_{\theta max}(a|s)$ is the maximum behavior probability; and $a_{max}$ is the maximum probability behavior.

The action includes changing of a lane to the left, changing of a lane to the right, and acceleration control, where the acceleration control is discretized into a plurality of driving behaviors based on a discrete range and a resolution.

The building a dynamic corner case completion library based on the human feedback according to a test result of the expert evaluation specifically includes:

evaluating existing scene testing processes by means of the human feedback, allowing testing scenes displayed by an existing scene driver to fall into dangerous scenes and general scenes, and recording testing processes evaluated as dangerous scenes in the dynamic corner case completion library based on the human feedback, where one element in the dynamic corner case completion library represents one complete testing process.

The dynamic corner case completion library is a rotating dynamic library, and in the testing process, if the library is full, earliest recorded test scenes are discarded to save latest corner cases, where the library is sized based on a storage capacity of a computing device.

The imitation learning driver uses a deep neural network to construct a mapping relationship between a scene state and an action, the network takes the scene state as an input, an action selection probability is determined based on a policy function of the imitation learning driver at a current time, and the action selection probability is normalized and then output.

An objective function of the imitation learning driver is to minimize a difference between a behavior selected by the policy function and a behavior recorded in the dynamic corner case completion library:

$$J(\theta) = \sum_{j=1}^{n}(a_{maxj}|s_j - a_j|s_j)^2; \text{s.t.: } s, a \in M_m$$

where $a_{maxj}|s_j$ represents a behavior corresponding to a maximum probability $p_{\theta max}(a/s_i)$ calculated by the policy function in an environmental state $s_i$; $a_j|s_j$ represents an actual behavior recorded in the dynamic corner case completion library based on the human feedback in the environmental state $s_i$; $M_m$ is an element set of the dynamic corner case completion library; n represents a number of times of policy making by the scene driver in a test; and θ is a parameter of the policy function, and is updated based on gradient descent in the deep neural network.

For selection of the scene driver, whether the original scene driver or the imitation learning driver is used in a current test is determined by using a vector product, with a formula as follows:

Scene driver used =

$$\begin{cases} \text{Original scene driver, others} \\ \text{Imitation learning driver, } \frac{s_{0n} \times s_{0m}}{|s_{0n} \times s_{0m}|} < -\eta \text{ or } \eta < \frac{s_{0n} \times s_{0m}}{|s_{0n} \times s_{0m}|} \end{cases}$$

where $s_{0n}$ is a scene state at the beginning of the current test, $s_{0m}$ is an initial state of test cases saved in the dynamic corner case completion library based on the human feedback, and η is a minimum similarity coefficient allowed for an initial scene.

During the selection of the scene driver, all initial states of the dynamic corner case completion library based on the human feedback are traversed.

Compared with the prior art, the present disclosure has the following beneficial effects:

(1) According to the present disclosure, a test method that combines active exploration by an original driver and reproduction by an imitation learning driver is adopted, thus solving the problem of incomplete scene testing caused by too little experience on the original driver and the problem of low testing efficiency caused by a low exposure rate of new corner cases obtained by exploration.

(2) According to the present disclosure, a dynamic corner case completion library based on human feedback is provided, so that new corner cases obtained by exploration can be effectively recorded. The imitation learning driver based on imitation learning is provided to learn a relationship between an environmental state and an action in the new corner cases, thereby avoiding omission of knowledge generated by the new corner cases.

(3) According to the present disclosure, whether the original scene driver or the imitation learning driver is used in a current test is determined by using a vector product, which effectively balances a contradiction between efficient exploration and testing. When there is a great difference from the dynamic corner case completion library based on the human feedback, the original driver is used for exploration to avoid the omission of corner cases. When there is a small difference from the dynamic corner case completion library based on the human feedback, the imitation learning driver is used for reproduction to improve testing efficiency.

DETAILED DESCRIPTION OF THE EMBODIMENTS

The present disclosure will be described in detail below with reference to the accompanying drawings and specific embodiments. The embodiments are implemented on the premise of the technical solutions of the present disclosure. The following presents detailed implementations and specific operation processes. The protection scope of the present disclosure, however, is not limited to the following embodiments.

Since an intelligence algorithm for a vehicle under test is not unchanging, a dangerous corner case is personalized. A driver with a high exploration trend is beneficial to dealing with the personalization of an intelligence algorithm, but the testing efficiency is low. A driver with high sample utilization has high testing efficiency, but the driver is likely to fall into local optimum and ignore the most dangerous working conditions. Therefore, the embodiments provide an intelligent driving test method with corner cases dynamically completed based on human feedback, to meet the challenge of exploration and utilization. The method mainly includes correcting behavior selection, providing a dynamic corner case completion library based on the human feedback, providing an imitation learning driver, and selecting a scene driver.

Figure 1:
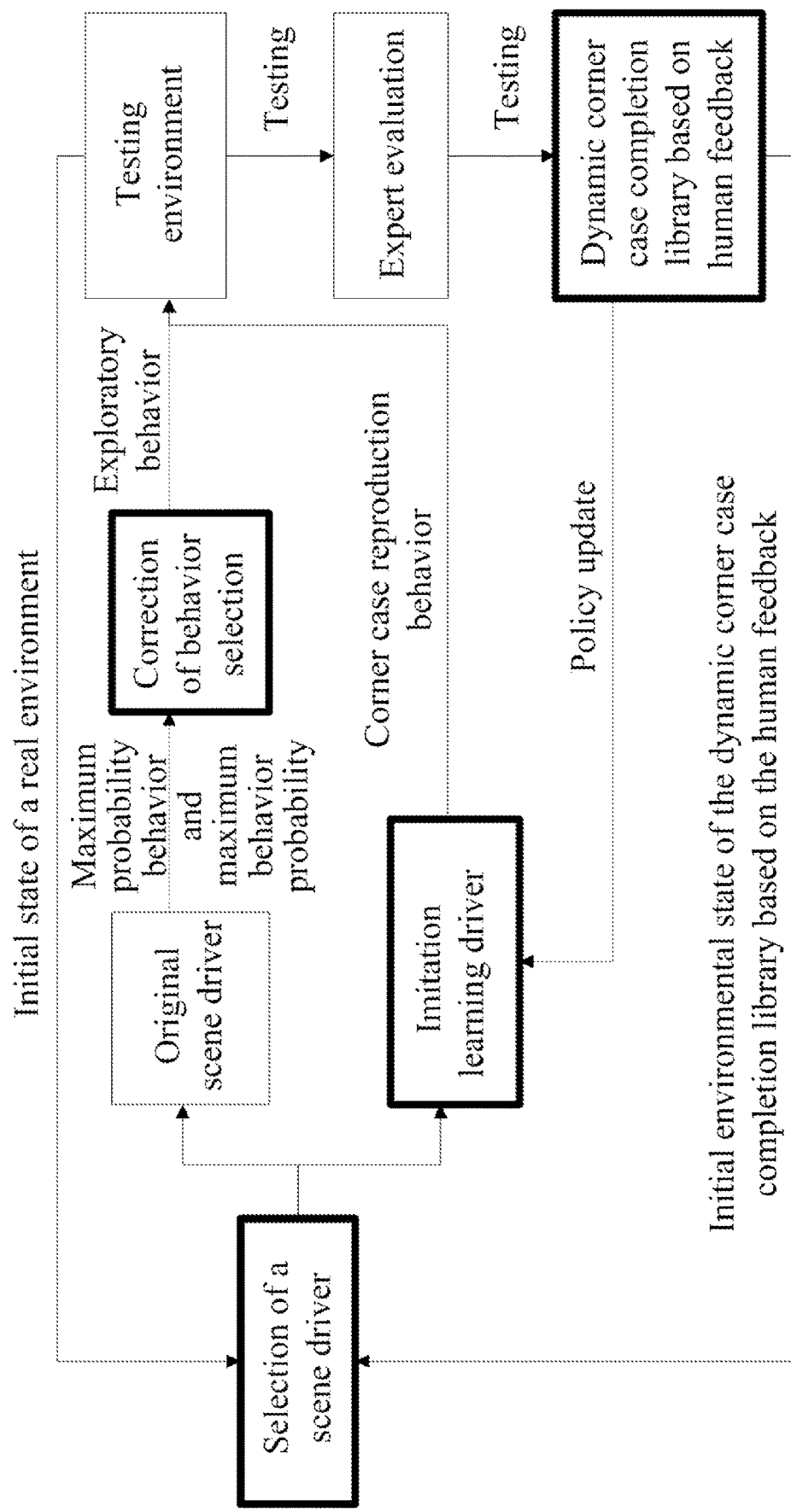
FIG. 1 is a flowchart of a method according to the present disclosure.

Specifically, as shown in FIG. 1, the method includes the following steps.

1) Model Construction and Training Stage

S1: Obtain an initial state of a real environment.

S2: Build an original scene driver based on reinforcement learning.

S3: Train the original scene driver with the initial state of the real environment as an input of the original scene driver, and output a maximum probability behavior and a maximum behavior probability.

The specific content of the original scene driver based on reinforcement learning belongs to conventional settings in this field, and thus is not repeated herein to avoid ambiguity of objectives of the present application.

S4: Correct behavior selection of an output of the original scene driver to obtain an exploratory behavior.

For the trained scene driver based on reinforcement learning, the policy is not updated in the testing process. This also leads to the fact that interaction experience of an existing scene driver depends on an intelligence algorithm adopted during the training. However, during actual use, algorithms provided on an intelligent vehicle under test are changeable. Because of their differences in characteristics, corresponding scene drivers should perform corresponding adjustments to cope with the differences. Therefore, the behavior selection of the output of the original scene driver is corrected to ensure a certain exploration ability.

Specifically, this step includes the following steps.

S41: Randomly generate a random number $\varepsilon$ that conforms to normal distribution and has a value in the range (0,1).

S42: Obtain a maximum behavior probability $p_{\theta max}(a|s)$ and a corresponding maximum probability behavior $a_{max}$ calculated by using a policy function of the original scene driver.

S43: Compare the random number with the maximum behavior probability $p_{\theta max}(a|s)$, determine a behavior being executed in a current state, and correct the behavior selection.

When the random number is less than the maximum behavior probability, a behavior $a_s=a_{max}$ being executed in the current state is selected, or else a behavior a $8=a$ r being executed in the current state is randomly selected, that is:

$$a_s = \begin{cases} a_{max}; & \text{if } p_{\theta max}(a|s) > \varepsilon \\ a_r; & \text{others} \end{cases}$$

where $\theta$ is a parameter of a policy function in a current scene driver; $p\theta(a|s)$ represents a probability of selecting an action $a$ under a current policy and environmental state $s$; $a_r$ represents a random action; $\varepsilon$ is a random number; $p_{\theta max}(a|s)$ is the maximum behavior probability; and $a_{max}$ is the maximum probability behavior.

In this embodiment, the environmental state s is defined as a relative position between an intelligent vehicle under test and each of traffic vehicles within the range of 200 m before and after the intelligent vehicle and 7 m on the left and right of the intelligent vehicle. Considering that the intelligent vehicle interacts with at most traffic vehicles in eight directions and the model calculation is complicated, a number of controlled traffic vehicles is set to 8. The action a is defined as a driving behavior of a controlled traffic vehicle, including changing of a lane to the left, changing of a lane to the right, and acceleration control. The acceleration control is discretized into 21 driving behaviors with a discrete range of [−4 m/s², 4 m/s²] and a resolution of 0.4 m/s² Therefore, a complete set of actions is defined as A, which is a matrix including 23 elements (the elements correspond to the changing of a lane to the left, the changing of a lane to the right, and 21 acceleration controls, respectively).

In another embodiment, the range and accuracy of the scene state s and the action a can be changed based on computing power of a test platform, which is not limited in the present disclosure.

In this embodiment, since the complete set of actions includes 23 elements, a random action $a_r$ may be selected by means of a positive random number $\varepsilon_r$ with a value in the range [1, 23].

S5: Test in a testing environment based on the exploratory behavior, perform expert evaluation, and build a dynamic corner case completion library based on the human feedback according to a test result of the expert evaluation.

Existing scene testing processes are evaluated by means of the human feedback, testing scenes displayed by an existing scene drive fall into dangerous scenes and general scenes, and testing processes evaluated as dangerous scenes are recorded in the dynamic corner case completion library based on the human feedback, where one element in the dynamic corner case completion library represents one complete testing process, that is, $\tau=[s_0, a_0, s_1, a_1, s_2 \ldots s_{n-1}, a_{n-1}, s_n]$. In this embodiment, the dynamic corner case completion library based on the human feedback is sized to 1,000, that is, $M_m=[\tau_1, \tau_2, \tau_3 \ldots \tau_{1000}]$. The size of the library may be modified based on a storage capacity of a computing device. It should be noted that the library is a rotating dynamic library, and after the library is full, earliest recorded test scenes are discarded to save latest corner cases.

S6: Build an imitation learning driver based on the human feedback, update a policy based on test data in the dynamic corner case completion library, train the imitation learning driver, and output a corner case reproduction behavior.

This step is mainly used to learn a decision policy in the dynamic corner case completion library based on the human feedback, and to reproduce a corner case after the same initial environmental state is encountered with. This can prevent a phenomenon that a differentiated corner case is obtained through exploration by the original scene driver, which leads to a low reproduction probability and low testing efficiency.

i) Building of a Policy Function

Figure 2:
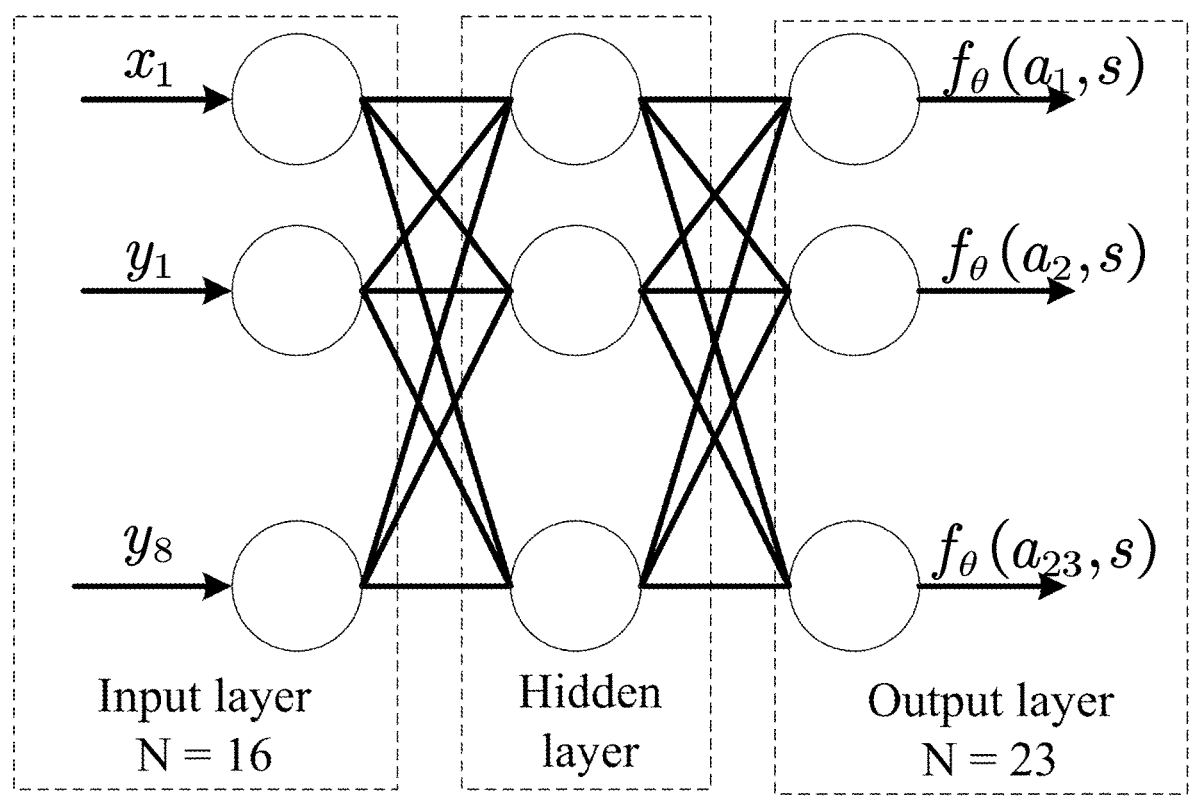
FIG. 2 is a schematic diagram of a policy gradient constructed based on a deep neural network according to an embodiment.

Since a test scene is continuous, a deep neural network is used herein to construct a mapping relationship between a scene state and an action. An input of the network is the scene state, that is, input=s=[$(x_1, y_1), (x_2, y_2) \ldots (x_8, y_8)$]; a subscript 8 corresponds to 8 controlled traffic vehicles; and an output is defined as an action selection probability, that is, output=[$f_{(\theta)}(a_1, s), f_{(\theta)}(a_2, s) \ldots f_{(\theta)}(a_{23}, s)$], where $\theta$ represents a parameter of the policy function at a current time. It should be noted that a number of hidden layers and a number of hidden nodes in the network may be changed based on the capability of a computing platform. In this embodiment, a one-way neural network is taken as an example, and the constructed deep neural network is shown in FIG. 2. FIG. 2 shows a decision function of one of the traffic vehicles, and policy functions of the remaining seven vehicles are constructed by using the same method, which is not repeated herein.

Further, the sum of probabilities of all actions considered is 1, and is not negative. The action selection probability output by the network is normalized, with a calculation process shown as follows:

$$p_\theta(a_i|s) = \frac{e^{f(\theta)(a_i,s)}}{\sum_{i=1}^{n=23} e^{f(\theta)(a_i,s)}}$$

ii) Building of an Objective Function of Imitation

Since the objective of this step is to learn the decision policy in the dynamic corner case completion library based on the human feedback, the objective function is to minimize a difference between a behavior selected by the policy function and a behavior in a scene, with a formula as follows:

$$J(\theta) = \sum_{j=1}^{n}(a_{maxj}|s_j - a_j|s_j)^2; \text{s.t.: } s, a \in M_m$$

where $a_{maxj}|s_j$ represents a behavior corresponding to a maximum probability $p_{\theta max}(a|s_i)$ calculated by the policy function in an environmental state $s_i$; $a_j|s_j$ represents an actual behavior recorded in the dynamic corner case completion library based on the human feedback in the environmental state $s_i$; $M_m$ is an element set of the dynamic corner case completion library; n represents a number of times of policy making by the scene driver in a test; and θ is a parameter of the policy function.

iii) The Parameter in the Policy Function is Updated Based on the Gradient Descent of the Objective Function in the Deep Neural Network, to Update and Train the Imitation Learning Driver.

2) Test Stage:

S7: Obtain the initial state of the real environment and an initial environmental state of the dynamic corner case completion library based on the human feedback, and select a scene driver.

To ensure the comprehensiveness and high efficiency of the testing process, it is necessary to fully explore test scenes composed of new intelligent vehicles under test and fully reproduce newly added dangerous corner cases that are obtained accidentally.

S8: Obtain a corresponding exploratory behavior or corner case reproduction behavior based on the selected scene driver with the initial state of the real environment as an input of the scene driver, and test in the testing environment based on the corresponding behavior to obtain a test result.

In this embodiment, whether the original scene driver or the imitation learning driver is used in a current test is determined by using a vector product, with a formula as follows:

$$\text{Scene driver used} = \begin{cases} \text{Original scene driver, others} \\ \text{Imitation learning driver, } \frac{s_{0n} \times s_{0m}}{|s_{0n} \times s_{0m}|} < -\eta \text{ or } \eta < \frac{s_{0n} \times s_{0m}}{|s_{0n} \times s_{0m}|} \end{cases}$$

where $s_{0m}$ is a scene state at the beginning of the current test, $s_{0m}$ is an initial state of test cases saved in the dynamic corner case completion library based on the human feedback, and η is a minimum similarity coefficient allowed for an initial scene, which is 0.01 in this embodiment. It should be noted that in this step, all initial states of the dynamic corner case completion library based on the human feedback need to be traversed.

In the testing process, step S1-S8 are repeated, parameters of each model are updated and trained, and test results are continuously output until a required number of testing times is completed, and thus the safety verification of the intelligent driving vehicle in this time is completed.

The foregoing is detailed description of the preferred specific embodiments of the present disclosure. It should be understood that a person of ordinary skill in the art can make various modifications and variations according to the concept of the present disclosure without creative efforts. Therefore, all technical solutions that a person skilled in the art can obtain based on the prior art through logical analysis, reasoning, or finite experiments according to the concept of the present disclosure shall fall within the protection scope determined by the claims.

What is claimed is:

1. An intelligent driving test method with corner cases dynamically completed based on human feedback, comprising the following steps:
   1) model construction and training stage:
   obtaining an initial state of a real environment;
   building an original scene driver based on reinforcement learning;
   training the original scene driver with the initial state of the real environment as an input of the original scene driver, and outputting a maximum probability behavior and a maximum behavior probability;
   correcting behavior selection of an output of the original scene driver to obtain an exploratory behavior;
   conducting testing in a testing environment based on the exploratory behavior, performing expert evaluation, and building a dynamic corner case completion library based on the human feedback according to a test result of the expert evaluation;
   building an imitation learning driver based on the human feedback, updating a policy based on test data in the dynamic corner case completion library, training the imitation learning driver, and outputting a corner case reproduction behavior; and
   2) test stage:
   obtaining the initial state of the real environment and an initial environmental state of the dynamic corner case completion library based on the human feedback, and selecting a scene driver; and
   obtaining a corresponding exploratory behavior or corner case reproduction behavior based on the selected scene driver with the initial state of the real environment as an input of the scene driver, and testing in the testing environment based on the corresponding behavior to obtain a test result.

2. The intelligent driving test method with corner cases dynamically completed based on human feedback according to claim 1, wherein the correcting behavior selection of an output of the original scene driver to obtain an exploratory behavior specifically comprises the following steps:
   randomly generating a random number that conforms to normal distribution and has a value in the range (0,1);
   obtaining a maximum behavior probability and a corresponding maximum probability behavior calculated by using a policy function of the original scene driver; and comparing the random number with the maximum behavior probability, determining a behavior being executed in a current state, and correcting the behavior selection.

3. The intelligent driving test method with corner cases dynamically completed based on human feedback according to claim 2, wherein the comparing the random number with the maximum behavior probability, determining a behavior being executed in a current state specifically comprises: when the random number is less than the maximum behavior probability, selecting a behavior $a_s=a_{max}$ being executed in the current state, or else randomly selecting a behavior $a_s=a_r$ being executed in the current state, that is:

$$a_s = \begin{cases} a_{max}; & \text{if } p_{\theta max}(a|s) > \varepsilon \\ a_r; & \text{others} \end{cases}$$

wherein $\theta$ is a parameter of a policy function in a current scene driver; $p_\theta(a|s)$ represents a probability of selecting an action a under a current policy and environmental state s, and the action is defined as a driving behavior of a controlled traffic vehicle; $a_r$ represents a random action; $\varepsilon$ is a random number; $p_{\theta max}(a|s)$ is the maximum behavior probability; and $a_{max}$ is the maximum probability behavior.

4. The intelligent driving test method with corner cases dynamically completed based on human feedback according to claim 2, wherein the action comprises changing of a lane to the left, changing of a lane to the right, and acceleration control, wherein the acceleration control is discretized into a plurality of driving behaviors based on a discrete range and a resolution.

5. The intelligent driving test method with corner cases dynamically completed based on human feedback according to claim 1, wherein the building a dynamic corner case completion library based on the human feedback according to a test result of the expert evaluation specifically comprises:

evaluating existing scene testing processes by means of the human feedback, allowing testing scenes displayed by an existing scene driver to fall into dangerous scenes and general scenes, and recording testing processes evaluated as dangerous scenes in the dynamic corner case completion library based on the human feedback, wherein one element in the dynamic corner case completion library represents one complete testing process.

6. The intelligent driving test method with corner cases dynamically completed based on human feedback according to claim 1, wherein the dynamic corner case completion library is a rotating dynamic library, and in the testing process, if the dynamic corner case completion library is full, earliest recorded test scenes are discarded to save latest corner cases, wherein the dynamic corner case completion library is sized based on a storage capacity of a computing device.

7. The intelligent driving test method with corner cases dynamically completed based on human feedback according to claim 1, wherein the imitation learning driver uses a deep neural network to construct a mapping relationship between a scene state and an action, the network takes the scene state as an input, an action selection probability is determined based on a policy function of the imitation learning driver at a current time, and the action selection probability is normalized and then output.

8. The intelligent driving test method with corner cases dynamically completed based on human feedback according to claim 1, wherein an objective function of the imitation learning driver is to minimize a difference between a behavior selected by the policy function and a behavior recorded in the dynamic corner case completion library:

$$J(\theta) = \sum_{j=1}^{n} (a_{maxj}|s_j - a_j|s_j)^2; \text{s.t.: } s, a \in M_m$$

wherein $a_{maxj}|s_j$ represents a behavior corresponding to a maximum probability $p_{\theta max}(a|s_i)$ calculated by the policy function in an environmental state $s_i$; $a_j|s_j$ represents an actual behavior recorded in the dynamic corner case completion library based on the human feedback in the environmental state $s_i$; $M_m$ is an element set of the dynamic corner case completion library; n represents a number of times of policy making by the scene driver in a test; and $\theta$ is a parameter of the policy function, and is updated based on gradient descent in the deep neural network.

9. The intelligent driving test method with corner cases dynamically completed based on human feedback according to claim 1, wherein for selection of the scene driver, whether the original scene driver or the imitation learning driver is used in a current test is determined by using a vector product, with a formula as follows:

Scene driver used =
$$\begin{cases} \text{Original scene driver, others} \\ \text{Imitation learning driver, } \frac{s_{0n} \times s_{0m}}{|s_{0n} \times s_{0m}|} < -\eta \text{ or } \eta < \frac{s_{0n} \times s_{0m}}{|s_{0n} \times s_{0m}|} \end{cases}$$

wherein $s_{0n}$ is a scene state at the beginning of the current test, $s_{0m}$ is an initial state of test cases saved in the dynamic corner case completion library based on the human feedback, and $\eta$ is a minimum similarity coefficient allowed for an initial scene.

10. The intelligent driving test method with corner cases dynamically completed based on human feedback according to claim 1, wherein during the selection of the scene driver, all initial states of the dynamic corner case completion library based on the human feedback are traversed.

* * * * *